(12) United States Patent
Kentsch

(10) Patent No.: US 8,089,276 B2
(45) Date of Patent: Jan. 3, 2012

(54) MAGNETIC FIELD SENSOR ASSEMBLY

(75) Inventor: Carsten Kentsch, Freiburg (DE)

(73) Assignee: Micronas GmbH, Freiburg i.Br. (DE)

( * ) Notice: Subject to any disclaimer, the term of this patent is extended or adjusted under 35 U.S.C. 154(b) by 514 days.

(21) Appl. No.: 12/274,564

(22) Filed: Nov. 20, 2008

(65) Prior Publication Data

US 2009/0140724 A1   Jun. 4, 2009

(30) Foreign Application Priority Data

Nov. 21, 2007   (EP) ..................................... 07022559

(51) Int. Cl.
*G01R 33/06* (2006.01)
(52) U.S. Cl. ...................... 324/251; 324/200; 324/207.2
(58) Field of Classification Search .................. None
See application file for complete search history.

(56) References Cited

U.S. PATENT DOCUMENTS

| 4,772,929 | A | 9/1988 | Manchester |
| 5,631,557 | A | 5/1997 | Davidson |
| 5,637,995 | A | 6/1997 | Izawa et al. |
| 5,883,567 | A | 3/1999 | Mullins, Jr. |
| 5,912,556 | A | 6/1999 | Frazee et al. |
| 5,963,028 | A | 10/1999 | Engel et al. |
| 7,148,638 | B2 * | 12/2006 | Wakefield et al. ............ 318/139 |
| 2004/0095129 | A1 | 5/2004 | Furlong |
| 2010/0181999 | A1 * | 7/2010 | Sudai et al. .................. 324/239 |

FOREIGN PATENT DOCUMENTS

| DE | 4200466 | 7/1992 |
| DE | 19620548 | 12/1996 |
| EP | 0537419 | 4/1993 |
| EP | 0544479 | 6/1993 |
| EP | 0680103 | 11/1995 |
| FR | 2852098 | 9/2004 |
| WO | 20060106454 | 10/2006 |

OTHER PUBLICATIONS

Daughton, "Spin-Dependent Sensors", Proceedings of the IEEE, 2003, pp. 681-686, vol. 91(5).
Chang et al., "A Novel Electro-Optical Magnetic Microsensor with Reducing Interference Packaging", Electronic Packaging Technology, 2007.
Popovic et al., "CMOS Magnetic Sensors with Integrated Ferromagnetic Parts", Sensors and Actuators A, 2006, pp. 94-99.
Baltes, "Future of IC Microtransducers", Sensors and Actuators A, 1996, pp. 179-192.
Lenz et al., "A High-Sensitivity Magnetoresistive Sensor", IEEE, 1990, pp. 114-117.

(Continued)

*Primary Examiner* — Jermele M Hollington
*Assistant Examiner* — Trung Nguyen
(74) *Attorney, Agent, or Firm* — Muncy, Geissler, Olds & Lowe, PLLC

(57) ABSTRACT

A magnetic field sensor assembly has at least one magnetic field sensor integrated into a semiconductor chip and has at least one magnetic field source. The semiconductor chip and the at least one magnetic field source are arranged in an encapsulation material in a predetermined position relative to each other in such a way that a magnetic field generated by the magnetic field source is detectable with the aid of at least one magnetic field sensor. The magnetic field source is arranged in the semiconductor chip and/or in the plane of extension of the semiconductor chip laterally adjacent to said chip.

14 Claims, 6 Drawing Sheets

OTHER PUBLICATIONS

Figure 1:
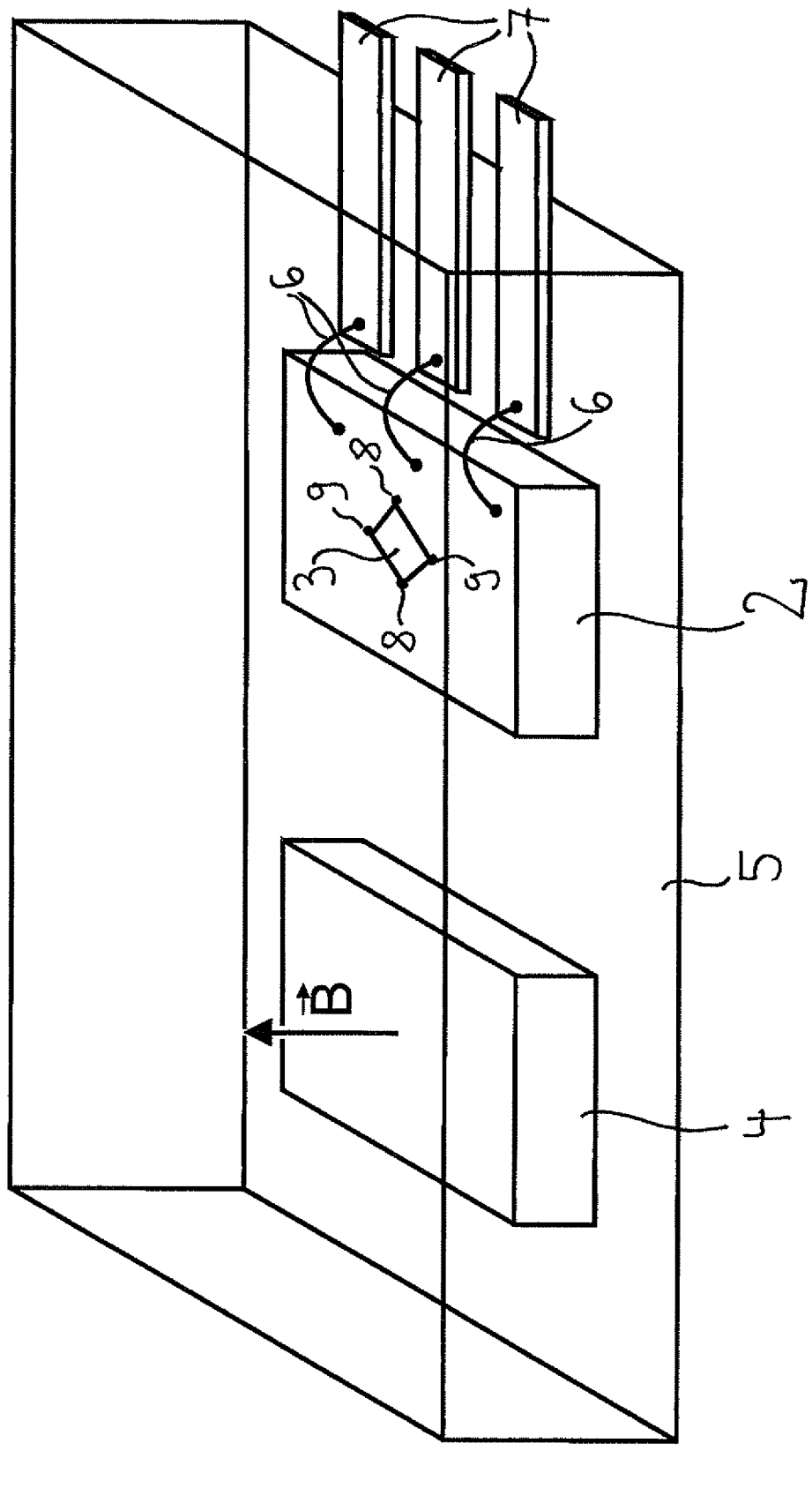

Motz et al., "A Chopped Hall Sensor with Small Jitter and Programmable 'True Power-On' Function", IEEE Journal of Solid State Circuits, 2005, pp. 1533-1540, vol. 40(7).

Ahn et al., "A Fully Integrated Micromagnetic Actuator with a Multilevel Meander Magnetic Core", Solid-State Sensor and Actuator Workshop, 1992, pp. 14-18.

Esashi et al., "Packaged Micromechanical Sensors", Emerging Technologies and Factory Automation, 1994, pp. 30-37.

Sadler et al., "Micromachined Semi-Encapsulated Spiral Inductors for Micro Electro Mechanical Systems (MEMS) Applications", IEEE Transactions on Magnetics, 1997, pp. 3319-3321, vol. 33(5).

Daughton, "GMR and SDT Sensor Applications", IEEE Transactions on Magnetics, 2000, pp. 2773-2777.

* cited by examiner

MAGNETIC FIELD SENSOR ASSEMBLY

The invention relates to a magnetic field sensor assembly having at least one magnetic field sensor integrated into a semiconductor chip and having at least one magnetic field source, wherein the semiconductor chip and the at least one magnetic field source are arranged in an encapsulation material in a predetermined position relative to each other in such a way that a magnetic field generated by the magnetic field source is detectable with the aid of at least one magnetic field sensor.

A magnetic field sensor assembly of this type is disclosed in U.S. Pat. No. 5,963,028. As a magnetic field source it has a permanent magnet configured as a bar magnet. Located on a pole surface at one end of the permanent magnet is A two-dimensional metallic carrier platelet, which contacts on one of its lower surfaces in a two-dimensional manner the pole surface of the permanent magnet. On the upper side of the carrier platelet a semiconductor chip is located in an approximately centered position relative to the pole surface, and it extends parallel to the carrier platelet and the pole surface and its rear side contacts the carrier platelet in a two-dimensional manner. A Hall-effect sensor is integrated in the semiconductor chip as a magnetic field sensor.

On its front side facing away from the permanent magnet the semiconductor chip has three electrical contacting points, which are connected with bond wires. A first bond wire is located at the first contact lug that is connected to the carrier platelet to form a single part, a second bond wire is connected to a second contact lug, and a third bond wire is connected to a third contact lug. The permanent magnet, the carrier platelet, and the semiconductor chip are completely, and the contact lugs are partially, encapsulated with an electrically insulating casting compound. For the purpose of connection to external electrical conductors or connections, the contact lugs project out of the casting compound at their end areas, which are located at a distance from the bond wires.

A rotating gear that comprises a soft magnetic material is associated with the magnetic field sensor assembly. The magnetic field sensor assembly is located on the outer periphery of a gear and is separated by an air gap from the gear in such a way that the magnetic flux produced by the permanent magnet flows through the gear. Depending on whether a tooth or a gap between teeth is positioned at the Hall-effect sensor, a different magnetic flux results in this sensor. The rotational movement of the gear can be detected with the aid of the magnetic field sensor assembly.

Since the magnetic field source is already integrated into the magnetic field sensor assembly, an additional magnetic field source, and thus the corresponding effort and expense for assembly and adjustment, is eliminated. However, it is disadvantageous that the magnetic field sensor assembly has relatively large dimensions. Therefore, for practical purposes it is not suitable for being installed in a narrow gap.

The object therefore is to provide a magnetic field sensor assembly of the type referred to above that makes it possible to have a flat design shape.

In accordance with the invention this object is accomplished in that the magnetic field source in the semiconductor chip and/or in the plane of extension of the semiconductor chip is located laterally adjacent to said semiconductor chip.

It is possible in an advantageous manner to reduce the design height of the magnetic field sensor assembly to the height of a corresponding semiconductor component that does not contain a magnetic field source. However, magnetically conductive materials that enter the area affected by the magnetic field produced by the magnetic field source and that change its flux density are detected-in a simple manner with the aid of the magnetic field sensor.

In a preferred embodiment of the invention the at least one magnetic field source has a permanent magnet. This makes it possible to have a relatively large magnetic flux and, consequently, for the magnetic field sensor assembly to have a high measurement sensitivity.

In a different preferred embodiment of the invention the at least one magnetic field source has a field coil that is connected to a power supply connection. The magnetic flux can then be adjusted depending on the given application by supplying the appropriate electrical power to the field coil. Here it is even possible for the field coil to be connected to an alternating current source in order to generate a magnetic alternating field and for a measurement coil to be provided as the magnetic field sensor. The supply of current to the field coil may be controlled by a control device that is integrated into the semiconductor chip.

In a further refinement of the invention, at least two magnetic field sources are disposed in the encapsulation material and the semiconductor chip is provided between these magnetic field sources. This results in a symmetrical construction that makes it possible to have a large change in the magnetic flux and therefore a high measurement sensitivity in the area of the magnetic field sensor when the magnetic field sensor assembly moves toward a ferromagnetic object and/or when the magnetic field sensor assembly moves away from the ferromagnetic object.

It is advantageous if the magnetic fields of the at least two magnetic field sources are oriented in such a way that they at least partially compensate each other at the magnetic field sensor. In this case, it is even possible for the direction of magnetization of at least two magnetic field sources to be arranged in and/or parallel to the plane of extension of the semiconductor chip and for these magnetic field sources to be magnetized in an opposite direction, so that the magnetic flux in the magnetic field sensor is approximately equal to zero if no magnetically conductive and/or magnetic material is located in the area affected by the magnetic field sources. The measurement signal of the magnetic field sensor may then be amplified to a relatively great degree by means of a measurement amplifier. The magnetic field sensor assembly then reacts with even greater sensitivity to changes in the magnetic conductivity and/or extraneous magnetic fields in its environment.

In a preferred embodiment of the invention at least one calibration coil that is connected to an adjustable current source is associated with the at least one permanent magnet in order to calibrate the magnetic field, and the magnetic field sensor is disposed in the area magnetically affected by the calibration coil. It is then possible to compensate for tolerances in the magnetization of the permanent magnet with the aid of the at least one calibration coil. It is even conceivable that a plurality of calibration coils, each of which is controllable by means of a current source assigned to it, can be disposed about the magnetic field sensor. In this case, the calibration coils preferably are provided in different sectors. If a ferromagnetic body approaches the magnetic field sensor from various directions, a predetermined detection sensitivity can be achieved with the aid of the calibration coils located in the various sectors, specifically a symmetrical detection sensitivity. The magnetic field sensor assembly may be used, for example, for absolute distance measurements.

It is advantageous if the field coil and/or calibration coil are integrated in the semiconductor chip. The magnetic field sensor assembly then makes it possible to have an even more compact and more cost-effective construction. The field coil may have conductive traces that are disposed in two or more layers of the semiconductor chip and that are connected to each other by means of vias.

In a preferred embodiment of the invention, at least four magnetic field sources are disposed in the encapsulation material around the semiconductor chip, preferably spaced at equal angular distances from each other. If the magnetic fields of the individual magnetic field sources are oriented in the same direction, a largely symmetrical magnetic flux density then results around the magnetic field sensor. It is also conceivable that at least two magnetic field sources are magnetized in opposing directions in order to achieve an asymmetrical magnetic flux density along a line traveling around the magnetic field sensor.

In a different embodiment of the invention the magnetic field source surrounds the at least one magnetic field sensor in an annular shape. This makes it possible to have an even more uniform distribution of the magnetic flux density around the magnetic field sensor.

The at least one magnetic field source and/or the calibration coil may be located with its axis of magnetization in and/or parallel to the plane of extension of the semiconductor chip. The magnetic field sensor then preferably has its greatest measurement sensitivity parallel to the axis of magnetization. In this case at least one vertical Hall-effect sensor is provided as a magnetic field sensor. However, it is also conceivable for the magnetic field sensor to be a magnetoresistive sensor.

The at least one magnetic field source and/or the calibration coil may then be arranged with its axis of magnetization also orthogonal to the plane of extension of the semiconductor chip. In this case, a horizontal Hall-effect sensor may be provided as the magnetic field sensor.

It is advantageous to integrate into the semiconductor chip a control and/or evaluation device that has at least one measurement signal input that is connected to a magnetic field sensor. The evaluation device may have a comparison device to compare the measurement signal of the at least one magnetic field sensor with a set value or set value range and/or filter to suppress interference signals.

In a preferred embodiment of the invention at least one field coil is attached to an alternating current source in order to generate a magnetic alternating field, and the control and/or an evaluation device has a correlation device that has a first input, which is connected to the at least one magnetic field sensor, and a second input, which is connected to the alternating current source. The magnetic field sensor assembly is then largely insensitive to magnetic interference fields.

Figure 2:
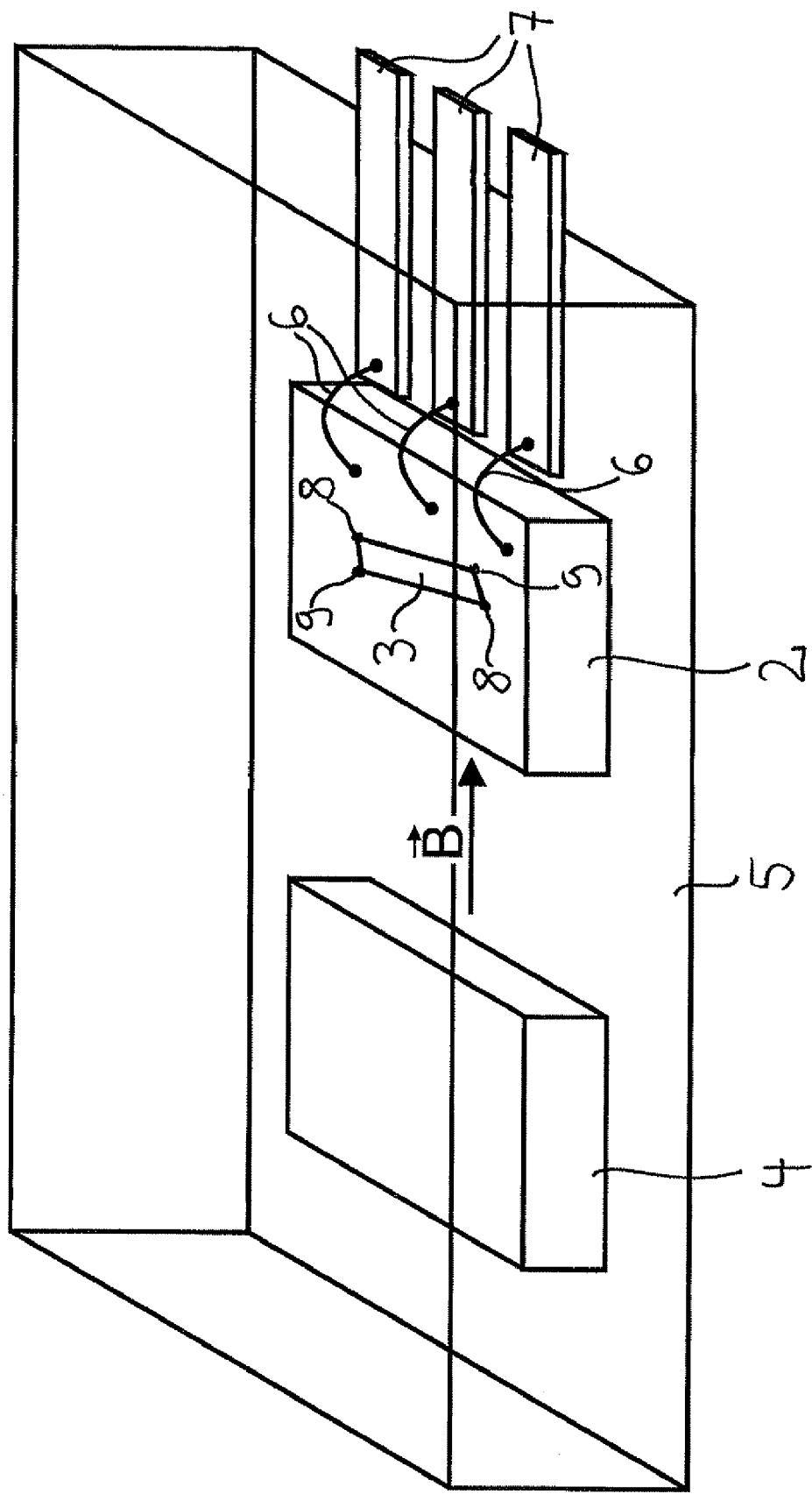
Figure 3:
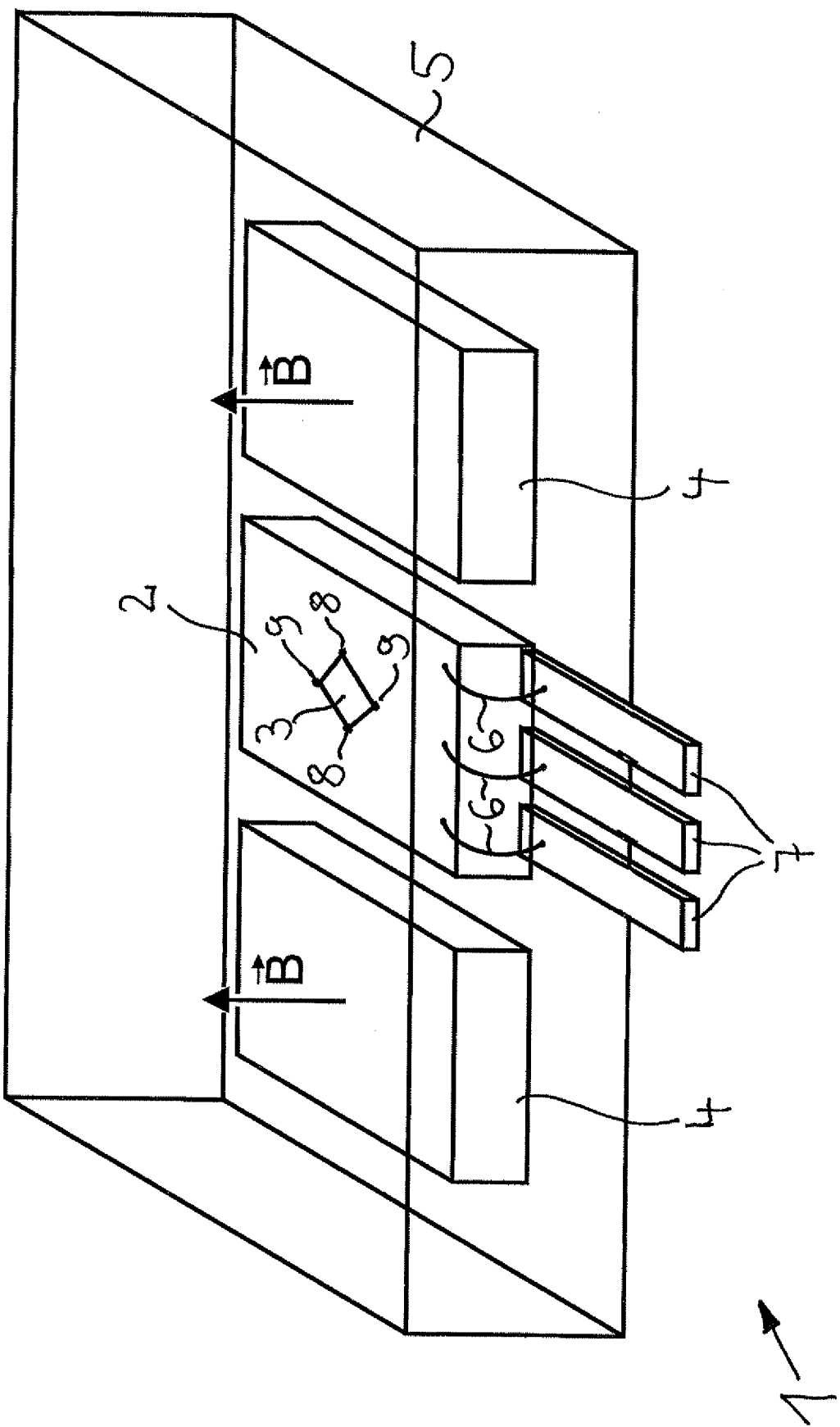
Figure 4:
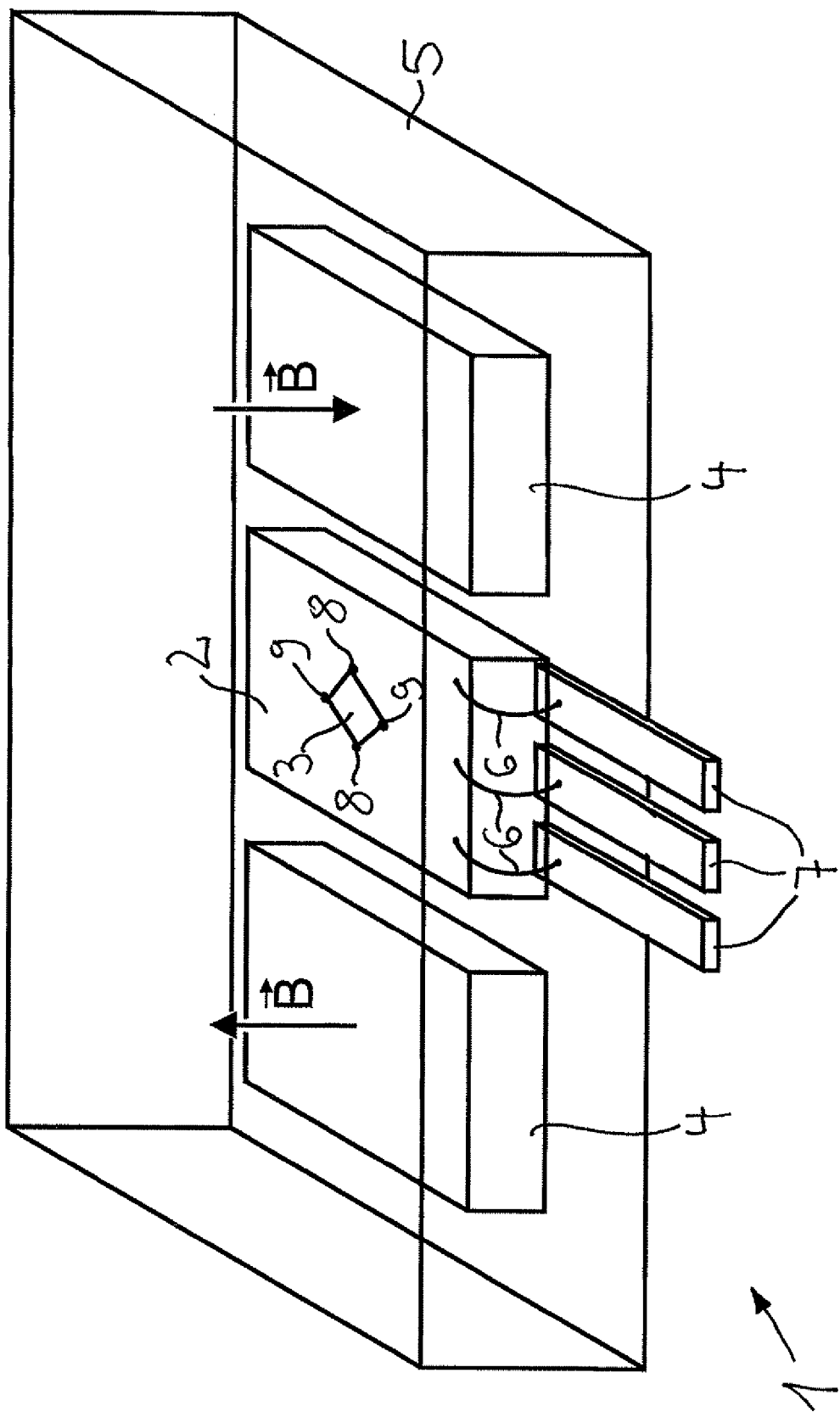

Example embodiments of the invention are explained in greater detail below on the basis of the drawing. The drawing shows:

FIGS. 1 and 2 a magnetic field sensor assembly that has in an encapsulation material a magnetic field sensor that is integrated into a semiconductor chip and a magnetic field source, FIGS. 3 and 4 a magnetic field sensor assembly in which two magnetic field sources are provided in the encapsulation material, between which the semiconductor chip is located.

Figure 5:
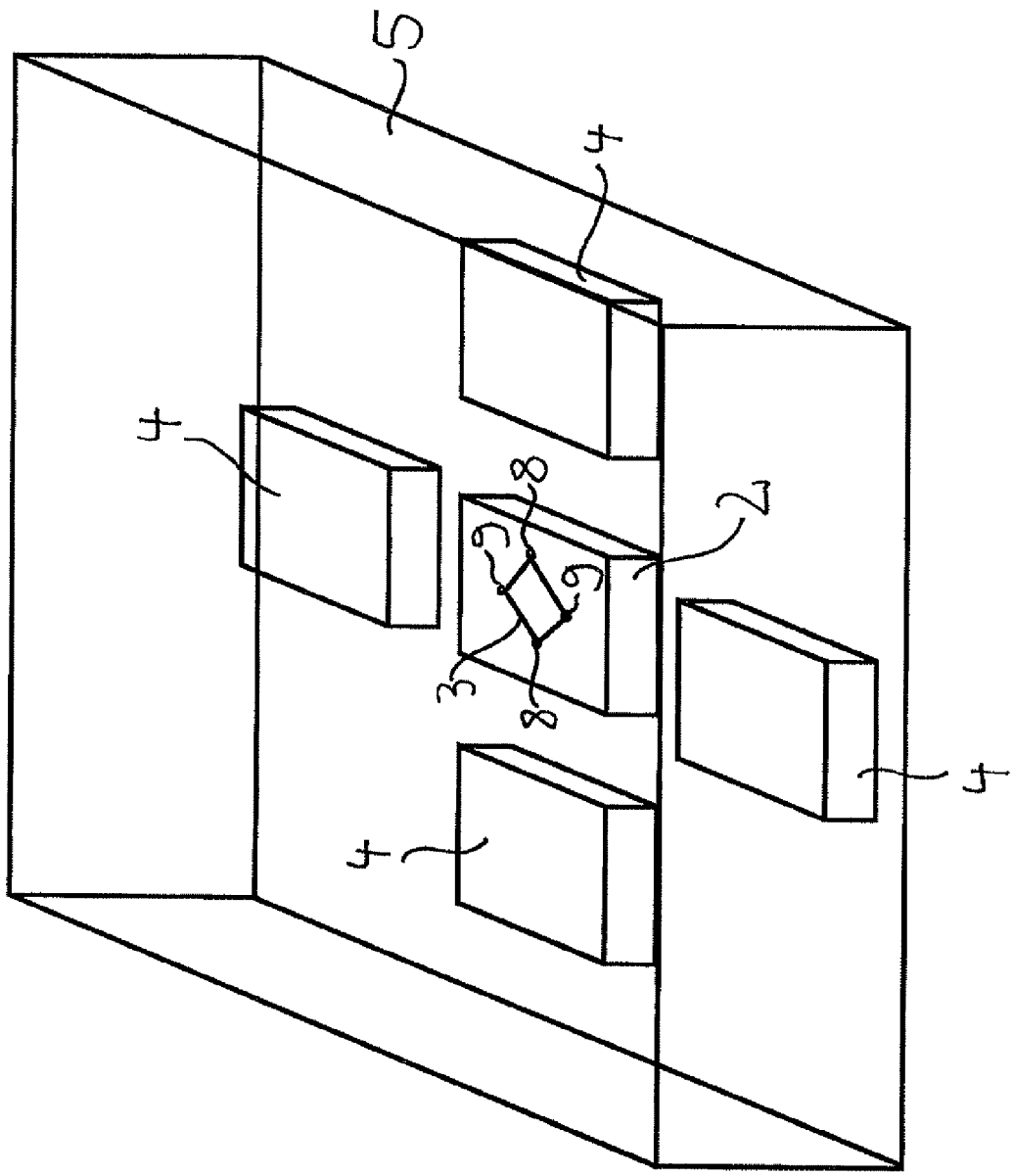
Figure 6:
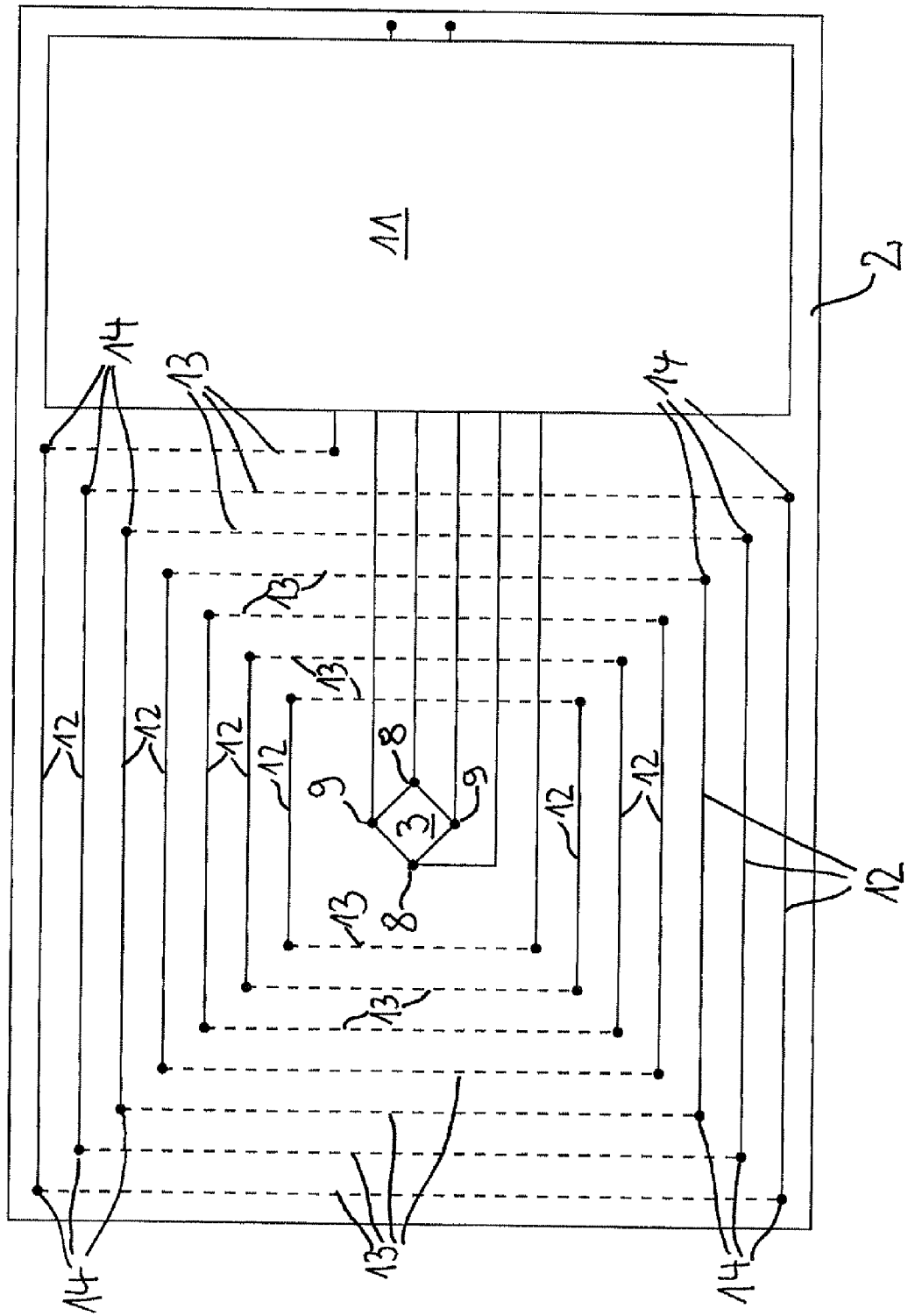

FIG. 5 a magnetic field sensor assembly in which four magnetic field sources are disposed in the encapsulation material around the semiconductor chip, and FIG. 6 a view of a semiconductor chip into which a magnetic field sensor, a calibration coil, and a control and evaluation device are integrated, and where conductive traces that are located in the interior of the semiconductor chip are represented with dashed lines.

A magnetic field sensor assembly identified in its entirety in FIG. 1 with 1 has a magnetic field sensor 3 that is integrated into a semiconductor chip 2 and that is disposed in the magnetic field of a permanently magnetic magnetic field source 4. Instead of the permanent magnet magnetic field source 4, a field coil that is connected to a power source may also be provided.

The semiconductor chip 2 and the magnetic field source 4 are embedded in an encapsulation material 5, in plastic, for example. The semiconductor chip 2 has a plurality of connecting points, each of which is connected to an electrical connecting contact 7 by means of a bond wire 6. The connection contacts 7 each have a first section that faces the semiconductor chip 2 and that is tightly injection-molded with the encapsulation material 5. A second section of the connecting contact 7 that is located some distance from the semiconductor chip 2 projects out of the encapsulation material 5 and can be connected to electrical leads.

The magnetic field sensor 3 is configured as a Hall-effect sensor that has a Hall-effect plate that has two first connections 8 that are diametrically opposed to each other in the plane of extension of the semiconductor chip 2 and that are used to feed in a measurement current. The first connections 8 are connected to a measurement current source that is not shown in FIG. 1 and that is integrated into the semiconductor chip 2.

In addition, the Hall-effect plate has two second connections 9 that are located diametrically opposed to each other in the plane of extension of the semiconductor chip 2 and that are connected to an impedance measurement amplifier that is integrated into the semiconductor chip 2.

In FIG. 1 it can be clearly seen that the magnetic field source 4 is located in the plane of extension of the semiconductor chip 2 laterally next to said chip, and that it is separated from said chip by the encapsulation material 5. However, it is also conceivable that the semiconductor chip 2 could be laterally directly adjacent to the magnetic field source 4.

In the example embodiment illustrated in FIG. 1 the magnetic field source 4 is magnetized transverse to and preferably normal to the plane of extension of the semiconductor chip 2. A so-called horizontal Hall-effect sensor is provided as the magnetic field sensor 3; its Hall-effect plate is disposed in the plane of extension of the semiconductor chip 2.

In the example embodiment shown in FIG. 2, the magnetic field source 4 is magnetized parallel to the plane of extension of the semiconductor chip 2. In this case, the direction of magnetization of the magnetic field source 4 runs approximately in the direction of the straight line that connects the magnetic field source 4 to the magnetic field sensor 3. However, other embodiments are conceivable in which the magnetization direction of the magnetic field source 4 does not run on such a connection line in the plane of extension of the semiconductor chip 2. In FIG. 2 a vertical Hall-effect sensor is provided as the magnetic field sensor 3; its Hall-effect plate is located approximately normal to the plane of extension of the semiconductor chip 2.

In the example embodiments shown in FIGS. 3 and 4, in each case two magnetic field sources 4 are located in the encapsulation material 5. In this case the semiconductor chip 2 is positioned approximately in the center between these magnetic field sources 4. It can be clearly seen that the semiconductor chip 2 and the magnetic field sources 4 are located approximately in the same plane.

In the example embodiment shown in FIG. 3 the magnetization of the magnetic field sources 4 is oriented in the same direction and is selected in such a way that the magnetic flux is increased in the magnetic field sensor 3 in comparison with a corresponding arrangement that is only enlarged by one magnetic field source 4. If a ferromagnetically conductive body is brought into the vicinity of the magnetic field sensor assembly 1, the symmetry of the magnetic field is disrupted, so that the magnetic flux flows through the magnetic flux sensor 3. The measurement signal of the magnetic field sensor 3 then changes accordingly.

In the example embodiment shown in FIG. 4, the two magnetic field sources 4 located on both sides of the magnetic field sensor 3 are oriented relative to each other in an opposing direction in such a way that the magnetic flux at the magnetic field sensor 3 is approximately equal to zero if no ferromagnetically conductive material is located in the vicinity of the magnetic field sensor assembly 1. If a ferromagnetically conductive body is brought into or removed from the vicinity of the magnetic field sensor assembly 1, the magnetic flux density at the magnetic field sensor 3 changes.

In the example embodiment shown in FIG. 5, four magnetic field sources 4 in the encapsulation material 5 are arranged at equal distances about the magnetic field sensor 3. Here, the individual magnetic field sensors 3 are each offset relative to each other by 90°. The magnetic field sensors 3 and the semiconductor chip 2 are once again are located in the same plane. Magnetic field sources 4 that are adjacent to each other may be magnetized in the same or opposite directions to each other.

In the example embodiment shown in FIG. 6, a calibration coil 10 is associated with at least one permanently magnetic magnetic field source 4, with which the magnetic flux in the magnetic field sensor 3 may be calibrated, for example in order to compensate for magnetic manufacturing tolerances in the magnetic field source(s) 4. The calibration coil 10 is connected to an adjustable current source that is provided in a control and/or evaluation device 11, which is only represented schematically in the drawing. The calibration coil 10 is integrated into the semiconductor chip 2 and has a plurality of first conductive traces 12 that run parallel to each other and that are located in a first conductive trace layer. In a second conductive trace layer a plurality of conductive traces 13 that run parallel to each other and that are connected in series with the first conductive traces 12 by means of vias 14 are provided. The windings of the calibration coil 10 then surround the magnetic field sensor 3.

In the example embodiment shown in FIG. 6 the magnetic field produced by the calibration coil 10 runs approximately orthogonal to the plane of extension of the semiconductor chip 2. However, calibration coils 10 in which the coil windings are arranged in the metallization layers of the semiconductor chip 2 in such a way that the magnetic field runs in the plane of extension of the semiconductor chip 2 and/or parallel to it are also conceivable.

It must also be noted that the control and/or evaluation device 11 may have an operating mode switching device by which means the calibration coil 10 may optionally or in alternation be connected to the power source or the measurement amplifier. In applications in which a calibration of the magnetic field is not necessary, the calibration coil 10 may be connected to the measurement amplifier in order to measure the electrical voltage induced by the magnetic field in the calibration coil 10.

The invention claimed is:

1. A magnetic field sensor assembly comprising:
    at least one magnetic field sensor integrated into a semiconductor chip; and
    at least one magnetic field source,
    wherein the semiconductor chip and the at least one magnetic field source are arranged in an encapsulation material in a predetermined position relative to each other in such a way that a magnetic field generated by the at least one magnetic field source is detectable with the aid of at least one magnetic field sensor,
    wherein the at least one magnetic field source is in a plane of extension of a main surface of the semiconductor chip and is located laterally adjacent to said chip,
    wherein said at least one magnetic field source is separated from said semiconductor chip by said encapsulation material or said at least one magnetic field source is directly adjacent to said semiconductor chip to provide a flat design shaped magnetic field sensor assembly suitable for installing in a narrow gap, and
    wherein the at least one magnetic field source has a permanent magnet.

2. The magnetic field sensor assembly of claim 1, wherein the at least one magnetic field source has a field coil that is connected to a power supply connection.

3. The magnetic field sensor assembly of one of claim 1, wherein at least two magnetic field sources are disposed in the encapsulation material and the semiconductor chip is provided between said magnetic field sources.

4. The magnetic field sensor assembly of claim 3, wherein the magnetic fields of the at least two magnetic field sources are oriented in such a way that they at least partially compensate for each other on the magnetic field sensor.

5. The magnetic field sensor assembly of claim 1, wherein at least one calibration coil is associated with the permanent magnet and is connected to an adjustable current source in order to calibrate the magnetic field and in that the magnetic field sensor is located in the area magnetically affected by the calibration coil.

6. The magnetic field sensor assembly of claim 5, wherein the calibration coil is integrated into the semiconductor chip.

7. The magnetic field sensor assembly of claim 5, wherein the at least one magnetic field source and/or calibration coil is disposed with its axis of magnetization in and/or parallel to the plane of extension of the semiconductor chip.

8. The magnetic field sensor assembly of claim 5, wherein the at least one magnetic field source and/or the calibration coil is disposed with its axis of magnetization orthogonal to the plane of extension of the semiconductor chip.

9. The magnetic field sensor assembly of claim 1, wherein at least four magnetic field sources are disposed in the encapsulation material around the semiconductor chip, preferably spaced at equal angular distances from each other.

10. The magnetic field sensor assembly of claim 1, wherein the magnetic field source surrounds the at least one magnetic field sensor an annular shape.

11. The magnetic field sensor assembly of claim 1, wherein at least one magnetic field sensor is a Hall-effect sensor, preferably a horizontal Hall-effect sensor, and/or a vertical Hall-effect sensor.

12. The magnetic field sensor assembly of claim 1, wherein a control and/or evaluation device that has at least one measurement signal input that is connected to the at least one magnetic field sensor is integrated into the semiconductor chip.

13. The magnetic field sensor assembly of claim 12, further including at least one field coil is connected to an alternating current source in order to generate a magnetic alternating field, and the control and/or evaluation device has a correlation device, which has a first input connected to the at least one magnetic field sensor and a second input connected to the alternating current source.

14. A magnetic field sensor assembly comprising:
- at least one magnetic field sensor integrated into a semiconductor chip;
- at least one magnetic field source; and
- a calibration coil configured to be connected to an adjustable current source, the calibration coil being integrated into the semiconductor-chip,
- wherein the semiconductor chip and the at least one magnetic field source are arranged in an encapsulation material in a predetermined position relative to each other in such a way that a magnetic field generated by the at least one magnetic field source is detectable with the aid of at least one magnetic field sensor,
- wherein the at least one magnetic field source is in a plane of extension of a main surface of the semiconductor chip and is located laterally adjacent to said chip, and
- wherein the at least one magnetic field sensor is a Hall sensor.

* * * * *